United States Patent [19]
Diebold et al.

[11] Patent Number: 6,127,254
[45] Date of Patent: Oct. 3, 2000

[54] METHOD AND DEVICE FOR PRECISE ALIGNMENT OF SEMICONDUCTOR CHIPS ON A SUBSTRATE

[75] Inventors: Ulrich Diebold, Herrenberg; Otto Torreiter, Leinfelden-Echterdingen; Hans Wiedemann, Boeblingen, all of Germany

[73] Assignee: International Business Machines Corporation, Armonk, N.Y.

[21] Appl. No.: 09/189,427

[22] Filed: Nov. 10, 1998

[30] Foreign Application Priority Data

Jan. 15, 1998 [DE] Germany ............................ 198 01 247

[51] Int. Cl.[7] .................................................... H01L 21/44
[52] U.S. Cl. ............................ 438/613; 438/612; 438/618
[58] Field of Search ...................................... 438/613, 612, 438/614, 618

[56] References Cited

U.S. PATENT DOCUMENTS 5,786,260  7/1998  Jang et al. .
5,888,884  3/1999  Wojnarowski .
5,924,623  7/1999  Kenney .

*Primary Examiner*—Kevin M. Picardat
*Assistant Examiner*—D. M. Collins
*Attorney, Agent, or Firm*—Jay H. Anderson

[57] ABSTRACT

A method and device are presented for precise alignment of a semiconductor chip on a substrate which, in a simple and cost-effective way, permit accurate alignment of individual chips on a substrate to be ensured.

9 Claims, 2 Drawing Sheets

METHOD AND DEVICE FOR PRECISE ALIGNMENT OF SEMICONDUCTOR CHIPS ON A SUBSTRATE

FIELD OF THE INVENTION

The present invention relates to a method for precise alignment of semiconductor chips on a substrate. Specifically, it relates to a method of the said kind for the alignment of semiconductor chips with controlled collapse chip connection (C4) solder pads. The invention also relates to a device for implementing the method.

BACKGROUND TO THE INVENTION

In testing of modern-day semiconductor chips it is in some cases necessary to contact well over 1000 signal pins. This problem can only be mastered at chip and wafer level by very complex and costly contactors.

In fault analysis of defective chips taken from a so-called multi-chip carrier, the additional problem arises of re-attaching a single chip of this kind to the tester; that is, the chip-C4 contacts must be restored in order then to be able to position and solder the tested chip on a chip carrier. Only then can the test be carried out on the test system.

In test procedures of this kind the chips under test are mounted on an associated chip carrier (substrate), on which the chips are fixed in position for testing. The substrate bears appropriate contact points (pads) which, after the chip has been pressed on to the substrate, are electrically connected to the contacts of the chip.

One possibility of forming the electrical contacts of the chip is by the so-called controlled collapse chip connections (C4). In this mode of contacting all electrical connections of the chip (signals and power supply) on the active chip side are routed to the surface of the chip and each fitted with one C4 pad (consisting of PbSn pellets). When the chip has been positioned on the substrate the chip is soldered together with the substrate in a continuous furnace; that is, the chip C4 pads are fused and soldered to the corresponding substrate pad.

In view of the large number of contact elements nowadays found on a single chip, it is very important to align the chips under test precisely on the substrate. In this regard it should be noted that such precise alignment of C4 chips of this kind is not possible using the edge of the chip, as the saw gap (wafer dicing) exhibits too high tolerances.

STATE OF THE ART

It is known that the individual chips can be aligned in their orientation to the substrate with the aid of a so-called split-field optic on a chip alignment device (cf. "The Fineplacer Technical Manual", The Fineplacer System, Finetech Electronics International, June 1992).

These optical alignment systems are based on the principle of simultaneous display of two images with the assistance of a stationary beam divider. One image shows the underside of the component under test, and is superimposed by the second image, showing the target area on the substrate. When both images are observed together, they permit comparison of the corresponding contact positions of the chip and substrate at a glance.

Such systems have the disadvantage that they are very complex and costly. Furthermore, they cannot be simply integrated into an existing test system. This means that the substrates must always be removed from the test system for chip positioning.

It is therefore the object of the present invention to deliver a method for precise alignment of semiconductor chips on a substrate which provides a simple and low-cost way of precisely aligning the individual chips on the substrates.

This and other objects are fulfilled by the method in accordance with claim 1.

Further advantageous embodiments of the method in accordance with the invention are presented in the subclaims.

The method in accordance with the invention is described in more detail in the following on the basis of the drawings.

DESCRIPTION OF THE INVENTION

In an advantageous design, the present invention uses thin pieces of polyimide foil, of which the edges serve as the stop rim for the C4 solder pads. Poly-(diphenyloxide-pyromelliteimide) (Kapton®) is preferentially used for the purpose. The foil is between 40 and 60 $\mu$m thick, preferentially 50 $\mu$m thick. It appears generally beneficial to select a foil thickness of around 60 to 75 percent of the height of the C4 pads. If the foil is too thin the rounded C4 pads may slip over the rim of the foil; this would mean the foil would not provide the stop function. If too thick a foil is selected it additionally captures the edge of the chip, which is not desired because the saw gap between the individual chips cut from a wafer exhibits too high tolerances.

Two identical pieces of foil are cut to size for each substrate. The shape of the foil pieces is based on the size of the chip being positioned, and consequently on the number of C4 pads per chip side which are to be touching the edge of the. foil. In this, an obtuse angle of the foil corners (>90°) prevents a C4 pad from catching on the corner of the foil when sliding along. The edges of the foil pieces which the C4 contacts are to be touching must be absolutely straight.

Figure 1:
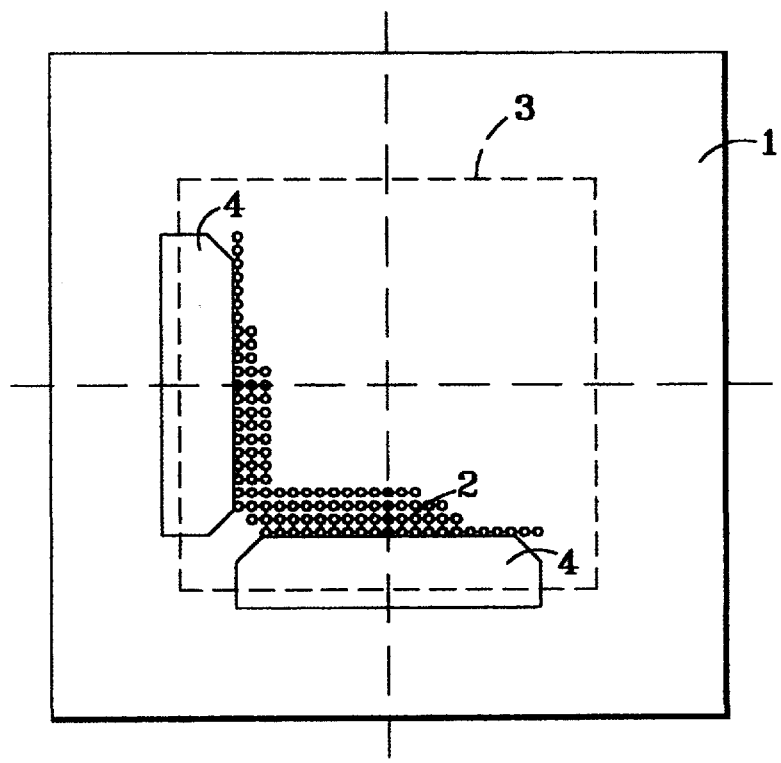
FIG. 1 shows a top view of the substrate with two pieces of foil mounted on it.

With the aid of an inspection tool which can be used to identify clearly the individual substrate pads (for example under a stereo microscope) the two pieces of foil are positioned on the substrate according to the subsequent chip placement, and affixed in place. A two-component epoxy adhesive is preferentially used for the purpose. This has the advantage that the pieces of foil can be removed again at any time by heating up the substrate/adhesive. If necessary, the foil can be heated up and its position then corrected/adjusted. FIG. 1 shows a top view of the substrate with two affixed pieces of foil. The substrate 1 bears appropriate contact points (pads) 2 which, after subsequent pressing-on of the chip 3 (only indicated indirectly in FIG. 1) onto the substrate, are electrically connected to the contacts of the chip. The two affixed foil pieces 4 are at right angles to each other, and are mounted along the outer edge of the contact points of the substrate.

In this way the foil pieces form a stop rim on the substrate, with a height corresponding to the thickness of the selected foil.

The C4 stop rims must be free of excess adhesive in order to ensure precise positioning. One way to achieve this is to subject the adhesive to controlled hardening with the aid of a hot plate.

The substrate to which the C4 stop foils have been affixed in the aforementioned way represents the contacting device for the chip under test.

In a first step the chip under test (with the correct chip rotation) is loosely mounted on the substrate in the vicinity of the two stop foils. Then it is adjusted plane-parallel to the stop foils.

As soon as the C4 chip contacts tangentially touch the two stop foils at the same time, the precise chip position has been attained.

Figure 2:
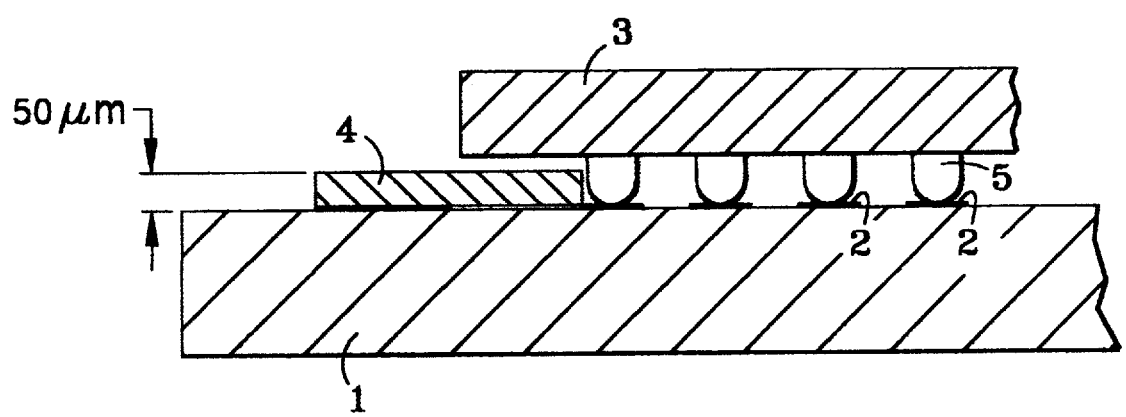
FIG. 2 shows a side view of the arrangement from FIG. 1.

FIG. 2 shows the arrangement of the substrate, stop foil and chip. The stop foil 4 lies along the outer edge of the contact points 2 of the substrate.

The chip is then pressed against the contact pads of the substrate at a defined pressure, for example with a compressed air driven stamp, thereby establishing an electrical contact between all C4 chip contacts and the substrate. Then the normal test sequence can be run through.

Figure 3:
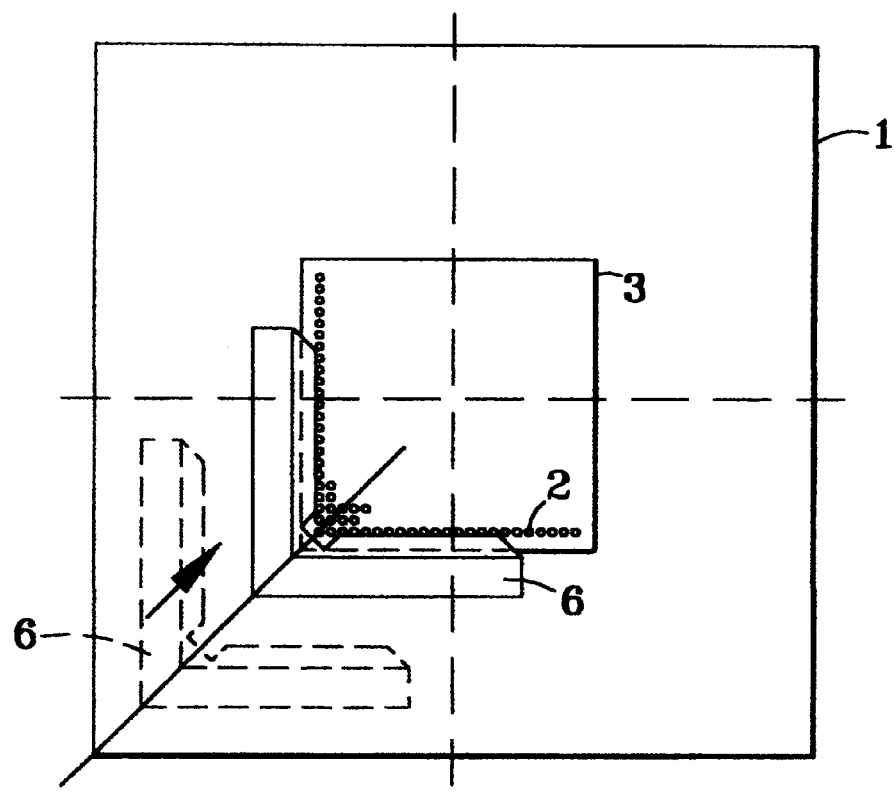
FIG. 3 shows a second embodiment of the invention.
Figure 4:
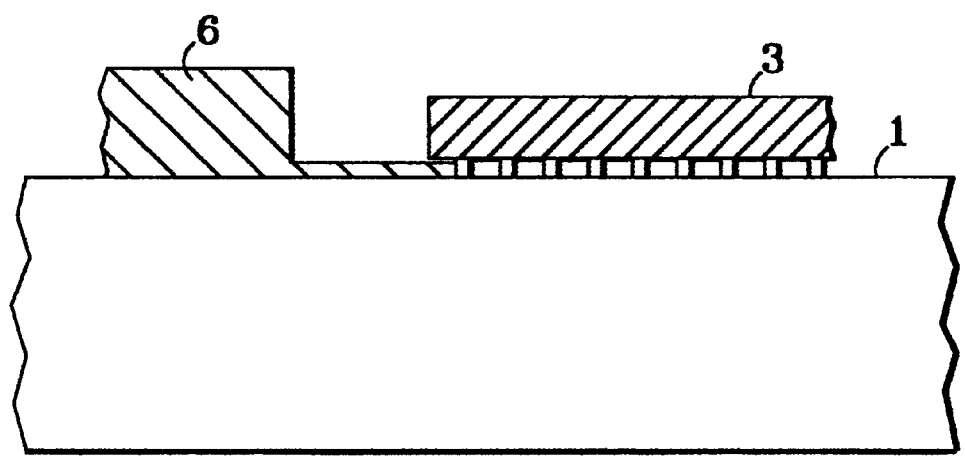
FIG. 4 shows the side view of the arrangement from FIG. 3.

In another preferred embodiment of the invention, the stop device may be of movable design, in order to cover different chip sizes. FIG. 3 shows a top view of a device of this kind. On the substrate 1 a sliding, adjustable stop rail 5 of electrically non-conductive heat-resistant material, such as DELRIN® or another ceramic material, is mounted. The said rail can be moved according to the size of the chip 6. FIG. 4 shows the side view of this design.

The invention is not limited to the examples cited, however. It also covers executions which soon come to mind for the technical specialist on reading the description.

What is claimed is:

1. A method for precise alignment of a semiconductor chip with controlled collapse chip connection (C4) solder pads on a substrate, the method comprising the steps of:
    providing a stop device on the substrate to serve as a stop for the C4 solder pads;
    placing the chip on the substrate so that the C4 pads face the substrate; and
    causing relative movement of the chip and the substrate parallel to the substrate, so as to bring C4 pads nearest an outer edge of the chip into contact with the stop device.

2. A method in accordance with claim 1, wherein the stop device comprises two thin pieces of polyimide foil.

3. A method in accordance with claim 2, wherein the thin foil is made from poly-(diphenyloxide-pyromelliteimide).

4. A method in accordance with claim 2 or claim 3, wherein the thin foil is removable from the substrate.

5. A method in accordance with claim 4, wherein the thin foil is affixed to the substrate by an epoxy adhesive.

6. A method in accordance with claim 2 or claim 3, wherein the thin foil is between 40 $\mu$m and 60 $\mu$m.

7. A method in accordance with claim 1, wherein the stop device is adjustable with respect to the substrate.

8. A method in accordance with claim 4, wherein the thin foil is between 40 $\mu$m and 60 $\mu$m thick.

9. A method in accordance with claim 5, wherein the thin foil is between 40 $\mu$m and 60 $\mu$m thick.

* * * * *